(12) United States Patent
Yamakage et al.

(10) Patent No.: US 11,871,521 B2
(45) Date of Patent: Jan. 9, 2024

(54) COMPONENT MOUNTING MACHINE

(71) Applicant: FUJI CORPORATION, Chiryu (JP)

(72) Inventors: Yusuke Yamakage, Anjo (JP);
Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 205 days.

(21) Appl. No.: 17/420,846

(22) PCT Filed: Jan. 22, 2019

(86) PCT No.: PCT/JP2019/001875
§ 371 (c)(1),
(2) Date: Jul. 6, 2021

(87) PCT Pub. No.: WO2020/152781
PCT Pub. Date: Jul. 30, 2020

(65) Prior Publication Data
US 2022/0095500 A1 Mar. 24, 2022

(51) Int. Cl.
*H05K 13/04* (2006.01)
*H05K 13/08* (2006.01)
*G01N 21/88* (2006.01)

(52) U.S. Cl.
CPC ..... *H05K 13/0812* (2018.08); *G01N 21/8806* (2013.01); *H05K 13/0404* (2013.01); *H05K 13/0813* (2018.08)

(58) Field of Classification Search
CPC .......... G01N 21/8806; H05K 13/0404; H05K 13/0812; H05K 13/0813
See application file for complete search history.

(56) References Cited

U.S. PATENT DOCUMENTS

| | | | |
|---|---|---|---|
| 8,302,291 B2* | 11/2012 | Ao | H05K 13/0812 414/752.1 |
| 2018/0321161 A1* | 11/2018 | Okada | G06T 7/70 |

FOREIGN PATENT DOCUMENTS

| | | |
|---|---|---|
| JP | 2003-249798 A | 9/2003 |
| JP | 2003-298294 A | 10/2003 |
| JP | 2004-356604 A | 12/2004 |
| JP | 2017-162845 A | 9/2017 |

OTHER PUBLICATIONS

International Search Report dated Feb. 26, 2019 in PCT/JP2019/001875 filed on Jan. 22, 2019, 1 page.

* cited by examiner

*Primary Examiner* — Paul D Kim
(74) *Attorney, Agent, or Firm* — Oblon, McClelland, Maier & Neustadt, L.L.P.

(57) ABSTRACT

A component mounting machine includes a mark imaging camera that images a board mark of a circuit board and has a function of identifying an identification target, such as a character attached to an upper surface of a component supplied by a component supply device. An illumination light source illuminates the identification target on the upper surface of the component imaged by the mark imaging camera and is attached to a lower portion of an electric component holding frame provided to protrude to the side of the mounting head. As the identification target on the upper surface of the component, which is illuminated by the illumination light source from obliquely above, is imaged by the mark imaging camera from above and the image is processed, the identification target on the upper surface of the component is identified.

4 Claims, 2 Drawing Sheets

COMPONENT MOUNTING MACHINE

TECHNICAL FIELD

The present specification discloses a technique related to a component mounting machine that has a function of identifying a character, a symbol, or a mark (hereinafter, referred to as an "identification target") attached to an upper surface of a component supplied by a component supply device.

BACKGROUND ART

As a component mounting machine of this type, there is a component mounting machine, in which a mark imaging camera that images a board mark of a circuit board, on which a component is mounted, images an identification target, such as a character and a mark, on an upper surface of the component supplied by a component supply device, such as a tape feeder, from above, and the image is processed to identify the identification target on the component upper surface, as described in Patent Literature 1 (JP-A-2004-356604). In this case, as an illumination light source for imaging the identification target on the component upper surface, a ring-shaped illumination light source provided in the mark imaging camera is used.

However, since an illumination angle (the optical axis angle of illumination light) with respect to an identification target, such as a character, on the component upper surface, is approximately 60° and an illumination angle suitable for identifying the identification target, such as a character, on the component upper surface, is larger than 10° to 45° in this configuration, it is difficult to identify the identification target, such as a character, on the component upper surface in some cases. In particular, in a case where the identification target, such as a character, on the component upper surface, is engraved by a laser, when the illumination angle is large, there is almost no brightness difference between the identification target and the component upper surface in the vicinity thereof, and the identification target, such as a character, cannot be identified at all.

Thus, as described in Patent Literature 2 (JP-A-2017-162845), there is a technique in which the number of illumination units of a mark imaging camera is increased to be on both sides in an X-direction, character identifying illumination light sources are arranged on both outer sides of a general illumination light source used in illuminating a board mark, and in a case of identifying a character on a component upper surface, by illuminating the character on the component upper surface with the character identifying illumination light sources positioned on both outer sides of the general illumination light source, an illumination angle with respect to the character on the component upper surface is made small and the character on the component upper surface is imaged and identified.

PATENT LITERATURE

Patent Literature 1: JP-A-2004-356604
Patent Literature 2: JP-A-2017-162845

BRIEF SUMMARY

Technical Problem

However, since the character identifying illumination light sources are arranged on both outer sides of the general illumination light source used in lighting the board mark in the configuration of Patent Literature 2, the illumination units attached on a lower side of the mark imaging camera are configured to greatly overhang on both outer sides of the camera. In this case, since the mark imaging camera is attached to a mounting head and both are integrally moved during a component pickup and mounting operation, there is a possibility that the illumination units of the mark imaging camera, which moves integrally with the mounting head during the component pickup and mounting operation, interfere with an object existing in the vicinity thereof or a mounted component on a circuit board and thereby damage the object or the mounted component.

Solution to Problem

In order to solve the problems, there is provided a component mounting machine including an illumination light source configured to illuminate a character, a symbol, or a mark (hereinafter, referred to as an "identification target"), which is attached to an upper surface of a component supplied by a component supply device, from obliquely above, a camera configured to image the identification target on the upper surface of the component, which is illuminated by the illumination light source from obliquely above, an image processing device configured to process an image captured by the camera to identify the identification target, a mounting head configured to pick up the component to mount the component on a circuit board, a head moving device configured to move the mounting head, and an electric component holding frame, being provided to move integrally with the mounting head, which is configured to hold a control board or cables of the mounting head, while the electric component holding frame protruding to a side of the mounting head, in which the illumination light source is attached to a lower portion of the electric component holding frame, and a mark imaging camera configured to move integrally with the mounting head and to image a board mark of the circuit board is used as the camera.

In short, the illumination light source is provided on the electric component holding frame in view of the fact that the electric component holding frame that holds electrical components, such as a control board and cables of the mounting head, is provided on the mounting head while protruding to the side of the mounting head. The illumination light source can be composed of a light emitting element, such as an LED, so as to be small in size, and a distance between the illumination light source and the mark imaging camera in a horizontal direction can be secured while avoiding an increase in the size of a structure moving integrally with the mounting head (a problem of interference between a peripheral object and a mounted component on the circuit board) by attaching the illumination light source to the electric component holding frame protruding to the side of the mounting head. Accordingly, without an increase in the size of the structure moving integrally with the mounting head, the illumination angle of the illumination light source with respect to the identification target on the upper surface of the component positioned below the mark imaging camera can be made as small as an illumination angle suitable for identifying the identification target by arranging the illumination light source at a position separated from the mark imaging camera in the horizontal direction, and the identification target on the upper surface of the component can be identified.

DESCRIPTION OF EMBODIMENTS

Figure 1:
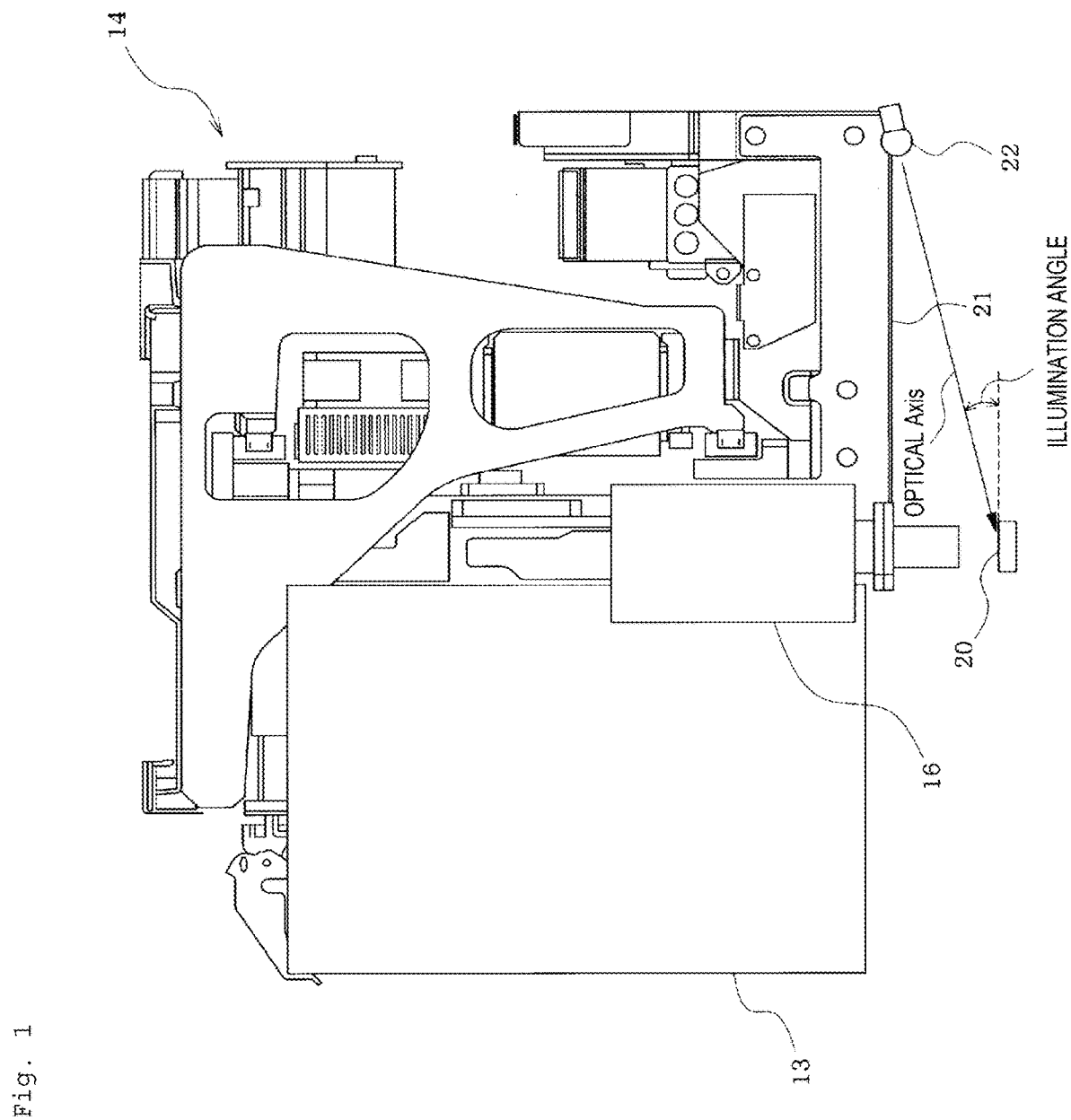
FIG. 1 is a side view showing a positional relationship among a mounting head, a mark imaging camera, an illumination light source, and an identification target on an upper surface of a component according to one embodiment.

Hereinafter, one embodiment disclosed in the present specification will be described. First, an overall configuration of component mounting machine 11 will be described briefly with reference to FIGS. 1 and 2.

Component supply device 12, such as a tray feeder and a tape feeder for supplying component 20, is set in component mounting machine 11 in a replaceable manner. Inside component mounting machine 11, head moving device 14 that moves mounting head 13 in a horizontal direction (X- and Y-directions) and an up-down direction (Z-direction) and conveyor 15 that loads/unloads a circuit board (not shown) are provided. One or multiple suction nozzles (not shown) for picking up component 20 supplied by component supply device 12 and mounting component 20 on the circuit board are held by mounting head 13 in a replaceable manner. Between component supply device 12 and conveyor 15, component imaging camera 19 that images component 20, which is picked up by the suction nozzle of mounting head 13, from below is provided to face upward.

Figure 2:
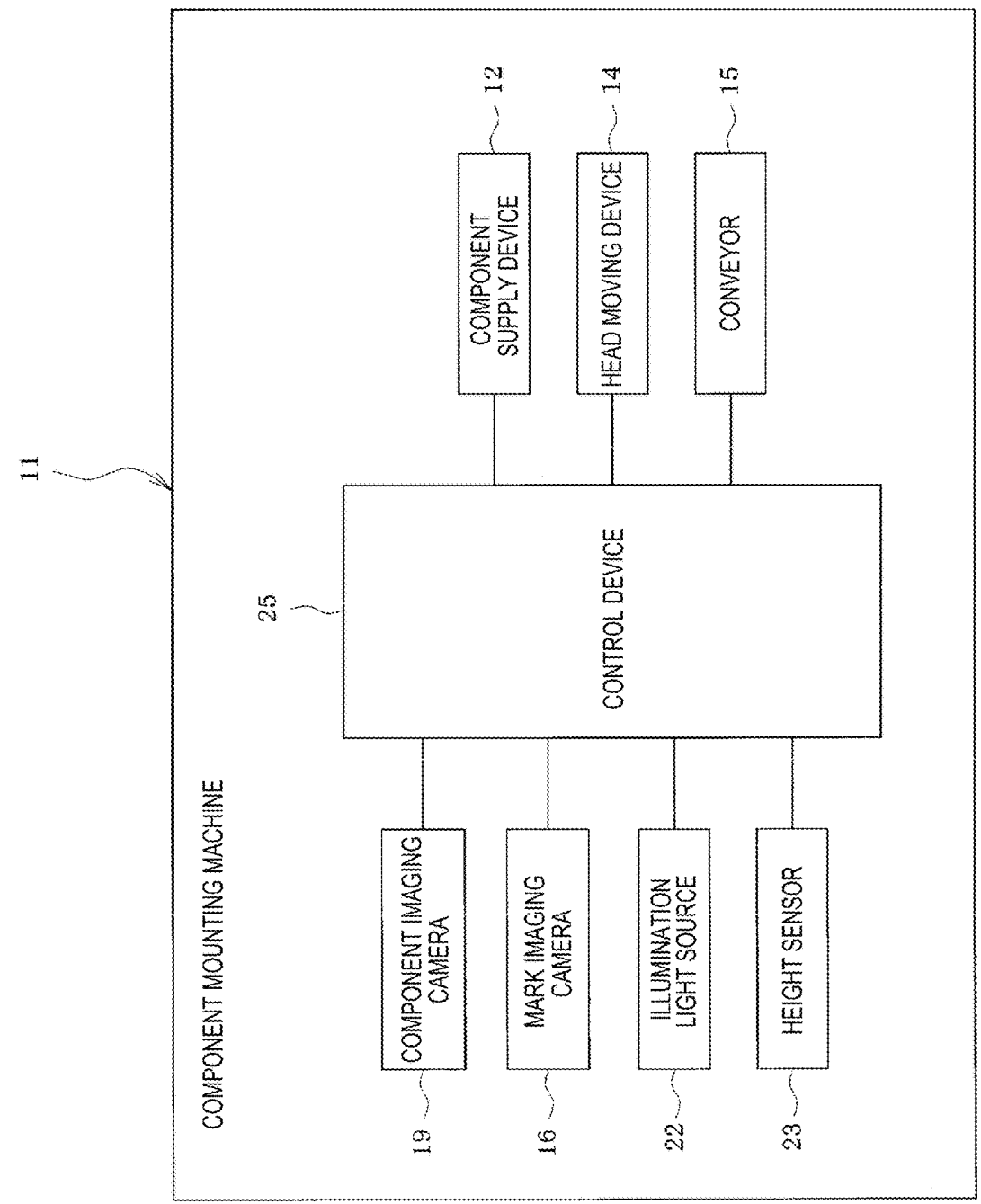
FIG. 2 is a block diagram showing a control system configuration of a component mounting machine.

As shown in FIG. 1, mark imaging camera 16 that images a board mark of a circuit board from above is attached downward to a side surface portion of mounting head 13, and mounting head 13 and mark imaging camera 16 are integrally moved in the X-, Y-, and Z-directions by head moving device 14. Electric component holding frame 21 that holds an electric component, such as a control board and cables of mounting head 13, is attached to mounting head 13 while protruding to the side of mounting head 13. Illumination light source 22 composed of a light emitting element, such as an LED, is attached to a lower portion of electric component holding frame 21. Illumination light source 22 is attached such that the amount by which illumination light source 22 protrudes from electric component holding frame 21 is as small as possible (more preferably, attached such that illumination light source 22 does not protrude from electric component holding frame 21), in order to set an attachment angle (angle of the optical axis) such that a character, a symbol, and a mark (hereinafter, referred to as an "identification target"), which is attached to an upper surface of component 20 supplied by component supply device 12, is illuminated from obliquely above, and to avoid illumination light source 22 interfering with an object existing on the periphery thereof or a mounted component on the circuit board during the movement of mounting head 13.

In this case, when a distance between mark imaging camera 16 and illumination light source 22 in the horizontal direction is excessively small, the illumination angle (angle of the optical axis) of illumination light source 22 with respect to the identification target on the upper surface of component 20 positioned below mark imaging camera 16 is excessively large, so that the identification target is unlikely to be identified. In consideration of this point, in the present embodiment, the distance between mark imaging camera 16 and illumination light source 22 in the horizontal direction is made as large as possible by attaching illumination light source 22 to an end portion of the lower portion of electric component holding frame 21, which is on an opposite side to the position of mark imaging camera 16, so that the illumination angle of illumination light source 22 with respect to the identification target on the upper surface of component 20 positioned below mark imaging camera 16 is made small.

Further, in the present embodiment, in consideration of the fact that the height of the upper surface of component 20 on a tray differs depending on a component type in a case where component supply device 12 is a tray feeder, height sensor 23 that measures the height of the upper surface of component 20 is attached downward to mounting head 13. As height sensor 23, for example, a non-contact height sensor, such as a laser type, an ultrasonic type, and an LED type, need only be used.

Control device 35 that controls an operation of each function of component mounting machine 11, which is described above, is composed of one or multiple computers (CPUs) and peripheral circuits thereof, and also functions as an image processing device that processes an image captured by mark imaging camera 16 or component imaging camera 19 to identify the identification target. When identifying the identification target on the upper surface of component 20 supplied by component supply device 12, control device 35 controls an operation of head moving device 14 such that mark imaging camera 16 is moved to a position above component 20 and mounting head 13 is moved in the up-down direction (Z-direction) until the height of illumination light source 22 from the upper surface of component 20 reaches a predetermined height with the height of component 20, which is measured by height sensor 23, as reference (that is, until the illumination angle of illumination light source 22 with respect to the identification target on the upper surface of component 20 reaches a predetermined angle). Accordingly, the identification target on the upper surface of component 20 is imaged by mark imaging camera 16 and is identified through image processing in a state where the illumination angle of illumination light source 22 with respect to the identification target on the upper surface of component 20 is adjusted such that the illumination angle of illumination light source 22 becomes an illumination angle suitable for identifying the identification target on the upper surface of component 20, that is, for example, falls within a range of 5° to 35° (more preferably, 10° to 20°).

At this time, in a case where the identification target on the upper surface of component 20 cannot be identified, control device 35 may cause head moving device 14 to change the height of illumination light source 22 by a predetermined amount so that the illumination angle of illumination light source 22 with respect to the identification target on the upper surface of component 20 is slightly changed, and perform image processing as mark imaging camera 16 images the identification target on the upper surface of component 20 again.

Further, an illumination light amount adjusting section (not shown) that adjusts an illumination light amount (brightness) of illumination light source 22 is provided, and in a case where the identification target on the upper surface of component 20 cannot be identified, the illumination light amount adjusting section may change the illumination light amount (brightness) of illumination light source 22 with respect to the identification target on the upper surface of component 20 and image processing may be performed as mark imaging camera 16 images the identification target on the upper surface of component 20 again.

In the present embodiment described above, a configuration where illumination light source 22 is provided on electric component holding frame 21 is adopted in view of the fact that electric component holding frame 21 that holds electrical components, such as a control board and cables of mounting head 13, is provided on mounting head 13 while protruding to the side of mounting head 13. Accordingly, illumination light source 22 can be composed of a light emitting element, such as an LED, so as to be small in size, and the distance between illumination light source 22 and mark imaging camera 16 in the horizontal direction can be secured while avoiding an increase in the size of a structure moving integrally with mounting head 13 (a problem of interference between a peripheral object and a mounted component on a circuit board) by attaching illumination light source 22 to electric component holding frame 21 protruding to the side of mounting head 13. Accordingly, without an increase in the size of the structure moving integrally with mounting head 13, the illumination angle of illumination light source 22 with respect to the identification target on the upper surface of component 20 positioned below mark imaging camera 16 can be made as small as an illumination angle suitable for identifying the identification target by arranging illumination light source 22 at a position separated from mark imaging camera 16 in the horizontal direction, and the identification target on the upper surface of component 20 can be identified.

Although mounting head 13 is moved in the horizontal direction (X- and Y-directions) and the up-down direction (Z-direction) by head moving device 14 in the present embodiment, a component mounting machine that picks up and mounts component 20 by causing head moving device 14 to move mounting head 13 only in the horizontal direction (X- and Y-directions) and causing the suction nozzle to move in the up-down direction (Z-direction) may be applied and realized.

In addition, it is evident that the present disclosure can be realized with various changes made without departing from the gist of the disclosure; for example, a position where illumination light source 22 is mounted on electric component holding frame 21 may be changed as appropriate, a position where mark imaging camera 16 is mounted on mounting head 13 may be changed as appropriate, or the shape of electric component holding frame 21 may be changed as appropriate.

REFERENCE SIGNS LIST 11 component mounting machine, 12 component supply device, 13 mounting head, 14 head moving device, 16 mark imaging camera, 20 component, 21 electric component holding frame, 22 illumination light source, 23 height sensor, 25 control device (image processing device)

The invention claimed is:

1. A component mounting machine comprising:
an illumination light source configured to illuminate an identification target which is attached to an upper surface of a component supplied by a component supply device, from obliquely above;
a mounting head configured to pick up the component to mount the component on a circuit board;
a camera configured to move integrally with the mounting head, to image the identification target on the upper surface of the component, and to image a board mark of the circuit board, which is illuminated by the illumination light source from obliquely above;
an image processing device configured to process an image captured by the camera to identify the identification target;
a head moving device configured to move the mounting head in each of an X direction, a Y direction, and a Z direction;
a control device configured to control the head moving device to moves the mounting head in the Z direction such that a height of the illumination light source from the upper surface of the component becomes a predetermined height; and
an electric component holding frame protruding from a side of the mounting head and provided to move integrally with the mounting head, which is configured to hold a control board or cables of the mounting head,
wherein the illumination light source is attached to a lower portion of the electric component holding frame.

2. The component mounting machine according to claim 1,
wherein the illumination light source is attached to an end portion of the lower portion of the electric component holding frame, which is on an opposite side to a position of the camera.

3. A component mounting machine comprising:
an illumination light source configured to illuminate an identification target which is attached to an upper surface of a component supplied by a component supply device, from obliquely above;
a mounting head configured to pick up the component to mount the component on a circuit board;
a camera configured to move integrally with the mounting head, to image the identification target on the upper surface of the component, and to image a board mark of the circuit board, which is illuminated by the illumination light source from obliquely above;
an image processing device configured to process an image captured by the camera to identify the identification target;
a head moving device configured to move the mounting head; and
an electric component holding frame protruding from a side of the mounting head and provided to move integrally with the mounting head, which is configured to hold a control board or cables of the mounting head,
wherein the illumination light source is attached to a lower portion of the electric component holding frame, and
wherein when the camera images the identification target on the upper surface of the component, a control device configured to control an operation of the head moving device controls the operation of the head moving device such that a height of the illumination light source from the upper surface of the component becomes a predetermined height, so that in a state where an illumination angle of the illumination light source with respect to the identification target on the upper surface of the component is adjusted to a predetermined angle, the camera images the identification target on the upper surface of the component.

4. A component mounting machine comprising:
an illumination light source configured to illuminate an identification target which is attached to an upper surface of a component supplied by a component supply device, from obliquely above;
a mounting head configured to pick up the component to mount the component on a circuit board;
a camera configured to move integrally with the mounting head, to image the identification target on the upper surface of the component, and to image a board mark of the circuit board, which is illuminated by the illumination light source from obliquely above;

an image processing device configured to process an image captured by the camera to identify the identification target;

a head moving device configured to move the mounting head; and an electric component holding frame protruding from a side of the mounting head and provided to move integrally with the mounting head, which is configured to hold a control board or cables of the mounting head, wherein the illumination light source is attached to a lower portion of the electric component holding frame, and wherein in a case where the identification target on the upper surface of the component is not able to be identified, the image processing device causes the head moving device to change a height of the illumination light source by a predetermined amount so that an illumination angle of the illumination light source with respect to the identification target on the upper surface of the component is changed, and performs image processing by causing the camera to image the identification target on the upper surface of the component again.

* * * * *